United States Patent
Wu et al.

(10) Patent No.: US 9,385,324 B2
(45) Date of Patent: Jul. 5, 2016

(54) ELECTRONIC SYSTEM WITH AUGMENTED REALITY MECHANISM AND METHOD OF OPERATION THEREOF

(71) Applicant: Samsung Electronics Co., Ltd., Gyeonggi-Do (KR)

(72) Inventors: Yun Z. Wu, San Francisco, CA (US); Jeff Beene, San Francisco, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 201 days.

(21) Appl. No.: 13/659,170

(22) Filed: Oct. 24, 2012

(65) Prior Publication Data

US 2013/0293579 A1 Nov. 7, 2013

Related U.S. Application Data

(60) Provisional application No. 61/643,848, filed on May 7, 2012.

(51) Int. Cl.
| | |
|---|---|
| *G09G 5/00* | (2006.01) |
| *H01L 51/00* | (2006.01) |
| *H04N 5/232* | (2006.01) |
| *G06K 9/00* | (2006.01) |
| *H04N 1/00* | (2006.01) |
| *H01L 51/50* | (2006.01) |
| *G06T 11/00* | (2006.01) |
| *H04N 101/00* | (2006.01) |

(52) U.S. Cl.
CPC .......... *H01L 51/006* (2013.01); *G06K 9/00671* (2013.01); *G06T 11/00* (2013.01); *H01L 51/0061* (2013.01); *H01L 51/0094* (2013.01); *H01L 51/5012* (2013.01); *H01L 51/5056* (2013.01); *H01L 51/5072* (2013.01); *H01L 51/5088* (2013.01); *H01L 51/5092* (2013.01); *H04N 1/00183* (2013.01); *H04N 5/23222* (2013.01); *H04N 5/23238* (2013.01); *H04N 5/23245* (2013.01); *H04N 2101/00* (2013.01)

(58) Field of Classification Search
USPC ................................................. 345/633, 629
See application file for complete search history.

(56) References Cited

U.S. PATENT DOCUMENTS

| | | | |
|---|---|---|---|
| 5,266,985 A | 11/1993 | Takagi | |
| 6,278,461 B1 | 8/2001 | Ellenby et al. | |
| 6,301,440 B1 * | 10/2001 | Bolle et al. | ................... 396/128 |
| 6,765,569 B2 | 7/2004 | Neumann et al. | |
| 7,038,715 B1 * | 5/2006 | Flinchbaugh | ...... H04N 1/00127 348/207.99 |
| 7,545,958 B2 * | 6/2009 | Ohmura et al. | ................ 382/112 |
| 7,616,248 B2 * | 11/2009 | Parulski et al. | ........... 348/333.11 |
| 7,805,066 B2 * | 9/2010 | Wexler et al. | ................... 396/49 |
| 7,809,162 B2 * | 10/2010 | Steinberg et al. | ............. 382/103 |
| 7,982,747 B1 * | 7/2011 | Dulaney et al. | ................ 345/619 |
| 8,126,321 B2 * | 2/2012 | Nagao et al. | ................... 396/49 |

(Continued)

FOREIGN PATENT DOCUMENTS

| | | |
|---|---|---|
| EP | 1280340 A2 | 1/2003 |
| EP | 2275864 A1 | 1/2011 |
| JP | 20070174548 A | 7/2007 |

*Primary Examiner* — M Good Johnson
(74) *Attorney, Agent, or Firm* — IP Investment Law Group

(57) ABSTRACT

A method of operation of an electronic system includes: scanning an image for detecting a subject; detecting a potential adjustment for moving the subject within the image; and selecting an augmentation for recommending the potential adjustment and for displaying the augmentation on a device.

19 Claims, 9 Drawing Sheets

(56) References Cited

U.S. PATENT DOCUMENTS

| | | | |
|---|---|---|---|
| 8,131,016 B2* | 3/2012 | Steinberg et al. | 382/103 |
| 8,233,789 B2* | 7/2012 | Brunner | 396/213 |
| 8,494,357 B2* | 7/2013 | Brunner | 396/213 |
| 8,625,018 B2* | 1/2014 | Bilbrey et al. | 348/333.01 |
| 8,675,991 B2* | 3/2014 | Steinberg et al. | 382/282 |
| 8,711,228 B2* | 4/2014 | Ko | 348/207.11 |
| 8,724,927 B2* | 5/2014 | Tighe | 382/298 |
| 2001/0048815 A1* | 12/2001 | Nakajima et al. | 396/310 |
| 2003/0231241 A1* | 12/2003 | Iida | 348/207.99 |
| 2005/0041839 A1* | 2/2005 | Saitou et al. | 382/103 |
| 2005/0088542 A1* | 4/2005 | Stavely et al. | 348/239 |
| 2005/0134719 A1* | 6/2005 | Beck | 348/333.11 |
| 2005/0195157 A1* | 9/2005 | Kramer et al. | 345/156 |
| 2005/0270381 A1* | 12/2005 | Owens et al. | 348/222.1 |
| 2005/0276596 A1 | 12/2005 | Chan et al. | |
| 2006/0170707 A1* | 8/2006 | Kokemohr | 345/629 |
| 2007/0024527 A1 | 2/2007 | Heikkinen et al. | |
| 2007/0025723 A1* | 2/2007 | Baudisch et al. | 396/287 |
| 2007/0263909 A1* | 11/2007 | Ojima et al. | 382/118 |
| 2008/0013799 A1* | 1/2008 | Steinberg et al. | 382/118 |
| 2008/0239104 A1* | 10/2008 | Koh | 348/240.99 |
| 2009/0073287 A1* | 3/2009 | Shimizu | 348/234 |
| 2009/0289955 A1* | 11/2009 | Douris et al. | 345/630 |
| 2009/0322897 A1* | 12/2009 | Park | 348/222.1 |
| 2010/0020194 A1* | 1/2010 | Hirooka | 348/229.1 |
| 2010/0110266 A1* | 5/2010 | Lee et al. | 348/333.02 |
| 2010/0231741 A1* | 9/2010 | Suzuki | 348/222.1 |
| 2011/0090390 A1 | 4/2011 | Narita | |
| 2011/0221771 A1 | 9/2011 | Cramer et al. | |
| 2012/0162374 A1* | 6/2012 | Markas et al. | 348/46 |
| 2012/0236173 A1* | 9/2012 | Telek et al. | 348/223.1 |
| 2013/0063644 A1* | 3/2013 | Jones et al. | 348/333.01 |
| 2013/0076792 A1* | 3/2013 | Takuma et al. | 345/634 |
| 2013/0162858 A1* | 6/2013 | Choi | 348/222.1 |
| 2013/0194437 A1* | 8/2013 | Osman | 348/207.1 |
| 2013/0286236 A1* | 10/2013 | Mankowski | 348/222.1 |

* cited by examiner

ELECTRONIC SYSTEM WITH AUGMENTED REALITY MECHANISM AND METHOD OF OPERATION THEREOF

CROSS-REFERENCE TO RELATED APPLICATION(S)

This application claims the benefit of U.S. Provisional Patent Application Ser. No. 61/643,848 filed May 7, 2012, and the subject matter thereof is incorporated herein by reference thereto.

TECHNICAL FIELD

The present invention relates generally to an electronic system, and more particularly to a system with augmented reality.

BACKGROUND ART

Modern portable consumer and industrial electronics, especially client devices such as electronic systems, cellular phones, digital cameras, digital camcorders, portable digital assistants, and combination devices, are providing increasing levels of display functionality to support modern life. Research and development in the existing technologies can take a myriad of different directions.

There are many technological solutions to take advantage of new display technology. Electronic systems have been incorporated in automobiles, notebooks, handheld devices, and other portable products. Today, these systems struggle to display relevant usable information, customer service, or products in an increasingly competitive and crowded market place.

Thus, a need still remains for an electronic system able to display assistance, information, and instruction useful to users. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems. Solutions to these problems have been long sought but prior developments have not taught or suggested any solutions and, thus, solutions to these problems have long eluded those skilled in the art.

DISCLOSURE OF THE INVENTION

The present invention provides a method of operation of an electronic system including: scanning an image for detecting a subject; detecting a potential adjustment for moving the subject within the image; and selecting an augmentation for recommending the potential adjustment and for displaying the augmentation on a device.

The present invention provides an electronic system, including: an identify subjects module for scanning an image and detecting a subject; a potential adjustment module, coupled to the identify subjects module, for detecting a potential adjustment and moving the subject within the image; and an augmentation selection module, coupled to the potential adjustment module, for selecting an augmentation and recommending the potential adjustment and for displaying the augmentation on a device.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
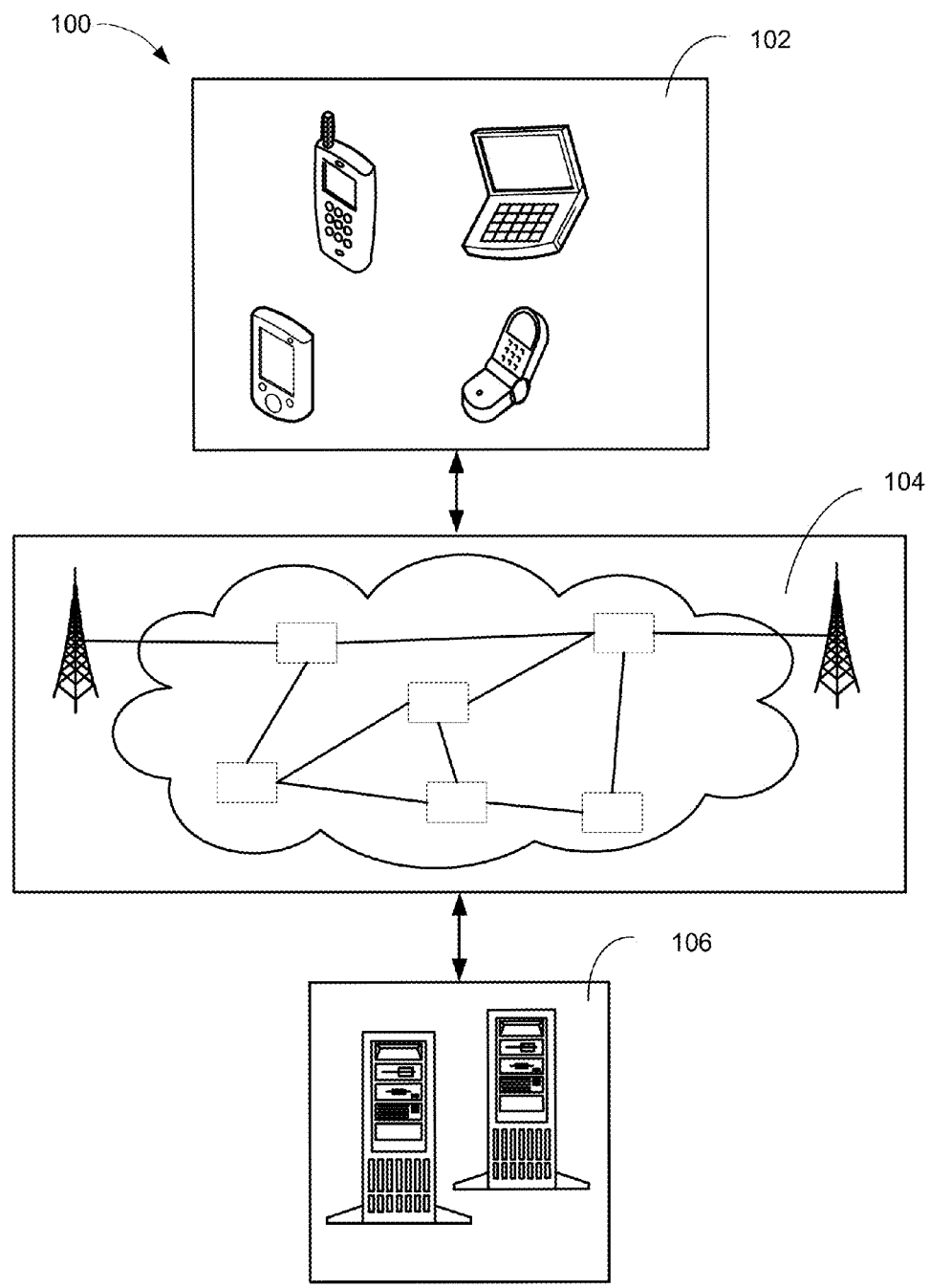
FIG. 1 is a functional block diagram of an electronic system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can operate in any orientation.

The term "module" referred to herein can include software, hardware, or a combination thereof of the present invention in accordance with the context in which the term is used. For example, the software can be machine code, firmware, embedded code, and application software. Also for example, the hardware can be circuitry, processor, computer, integrated circuit, integrated circuit cores, a sensor, a micro-electromechanical system (MEMS), passive devices, or a combination thereof.

Referring now to FIG. 1, therein is shown a functional block diagram of an electronic system 100 in an embodiment of the present invention. The electronic system 100 includes a first device 102, such as a client or a server, connected to a second device 106, such as a client or server, with a communication path 104, such as a wireless or wired network.

For example, the first device 102 can be of any of a variety of devices and can include image capture capability, such as a cellular phone, personal digital assistant, a notebook computer, other multi-functional mobile communication or entertainment device or even stationary devices including appliances with digital displays, televisions, or desktop computer monitors. The first device 102 can be a standalone device, or can be incorporated with a vehicle, for example a car, truck, bus, or train. The first device 102 can couple to the communication path 104 to communicate with the second device 106. Coupling is defined as a physical connection.

For illustrative purposes, the electronic system 100 is described with the first device 102 as a mobile computing device, although it is understood that the first device 102 can be different types of computing devices. For example, the first device 102 can also be a non-mobile computing device, such as a server, a server farm, or a desktop computer.

The second device 106 can be any of a variety of centralized or decentralized computing devices. For example, the second device 106 can be a computer, grid-computing resources, a virtualized computer resource, cloud computing resource, routers, switches, peer-to-peer distributed computing devices, or a combination thereof.

The second device 106 can be centralized in a single computer room, distributed across different rooms, distributed across different geographical locations, embedded within a telecommunications network. The second device 106 can have a means for coupling with the communication path 104 to communicate with the first device 102. The second device 106 can also be a client type device as described for the first device 102.

In another example, the first device 102 can be a particularized machine, such as a mainframe, a server, a cluster server, rack mounted server, or a blade server, or as more specific examples, an IBM System z10™ Business Class mainframe or a HP ProLiant ML™ server. Yet another example, the second device 106 can be a particularized machine, such as a portable computing device, a thin client, a notebook, a netbook, a smartphone, personal digital assistant, or a cellular phone, and as specific examples, an Apple iPhone™, Palm Centro™, or Moto Q Global™.

For illustrative purposes, the electronic system 100 is described with the second device 106 as a non-mobile computing device, although it is understood that the second device 106 can be different types of computing devices. For example, the second device 106 can also be a mobile computing device, such as notebook computer, another client device, or a different type of client device. The second device 106 can be a standalone device, or can be incorporated with a vehicle, for example a car, truck, bus, or train.

Also for illustrative purposes, the electronic system 100 is shown with the second device 106 and the first device 102 as end points of the communication path 104, although it is understood that the electronic system 100 can have a different partition between the first device 102, the second device 106, and the communication path 104. For example, the first device 102, the second device 106, or a combination thereof can also function as part of the communication path 104 or part of cloud computing where the first device 102, the second device 106, or the combination thereof provide distributed computing.

The communication path 104 can be a variety of networks. For example, the communication path 104 can include wireless communication, wired communication, optical, ultrasonic, or the combination thereof. Satellite communication, cellular communication, Bluetooth, Infrared Data Association standard (IrDA), wireless fidelity (WiFi), and worldwide interoperability for microwave access (WiMAX) are examples of wireless communication that can be included in the communication path 104. Ethernet, digital subscriber line (DSL), fiber to the home (FTTH), and plain old telephone service (POTS) are examples of wired communication that can be included in the communication path 104.

Further, the communication path 104 can traverse a number of network topologies and distances. For example, the communication path 104 can include direct connection, personal area network (PAN), local area network (LAN), metropolitan area network (MAN), wide area network (WAN) or any combination thereof.

Figure 2:
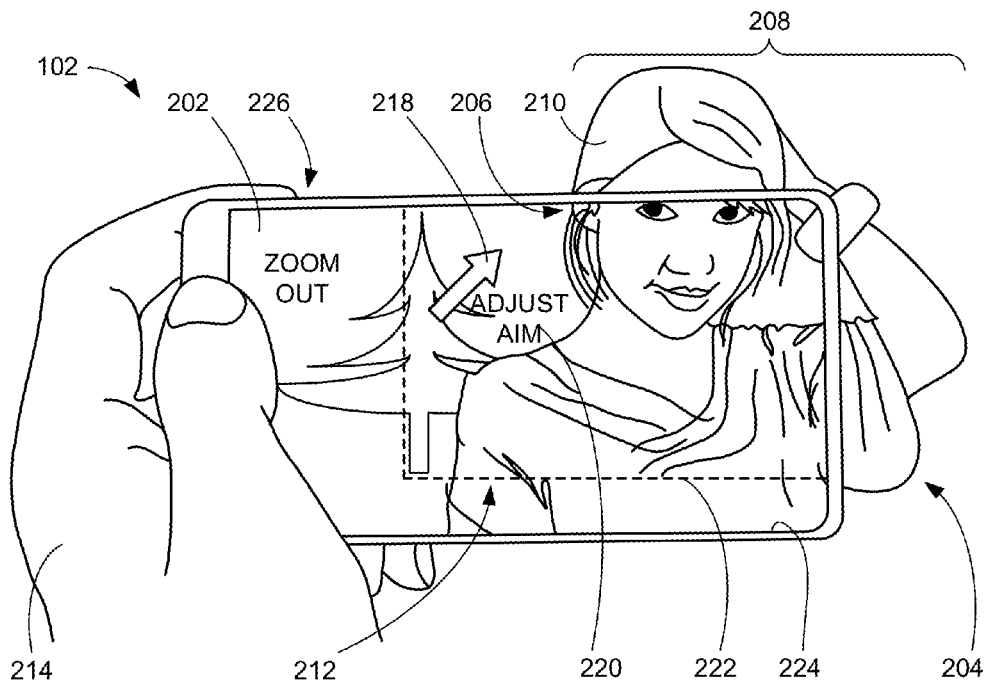
FIG. 2 is a pictorial view of the first device depicting an aiming augmentation.

Referring now to FIG. 2, therein is shown a pictorial view of the first device 102 depicting an aiming augmentation. The first device 102 is shown having a display 202. The display 202 can depict subjects 204.

The subjects 204 can be entities in a photograph or video such as a person, a building, an animal, a mountain, or some combination. The first device 102 can include potential adjustments 206 for moving the subjects 204 within the display 202. The potential adjustments 206 are modifications by movement of the subjects 204 within the display 202 including changing geographical location of the first device 102, pivoting about one or more axes of the first device 102, or modifying focal length of the first device 102.

The potential adjustments 206 can be a size change 208 when the subjects 204 are improperly sized on the display 202 described in detail below. The potential adjustments 206 can be a composition change 210 when the subjects 204 are improperly framed, such as, when the subjects 204 are cropped or directly centered described in detail below.

The first device 102 provides augmentations 212 to recommend the potential adjustments 206 of the subjects 204 detected on the display 202. The augmentations 212 are visual aids to instruct a user 214 to make the potential adjustments 206 of the subjects 204.

The augmentations 212 can be graphical overlays such as arrows 218, text 220, or informational lines 222. The augmentations 212 can be used in combination to recommend the potential adjustments 206 of the subjects 204. As an example, the arrows 218 can be coupled with the text 220 to indicate the composition change 210 of the subjects 204 within the display 202 of the first device 102 is recommended.

As a further example, the informational lines 222 can surround the subjects 204 and indicate where edges 224 of an image 226 on the display 202 should be for the composition change 210 the subjects 204 within the display 202. The informational lines 222 can be stationary around and with respect to the subjects 204.

The augmentations 212 can also recommend the size change 208 of the subjects 204 within the display 202. As an example, the augmentations 212 can be the text 220 indicating that the user 214 should "ZOOM OUT" for size change 208 the subjects 204 within the display 202 described in detail below. The augmentations 212 can aid and instruct the user 214 in the proper composition of a photograph or video by recommending the potential adjustments 206 for moving the subjects 204 captured by the first device 102 within the display 202.

Figure 3:
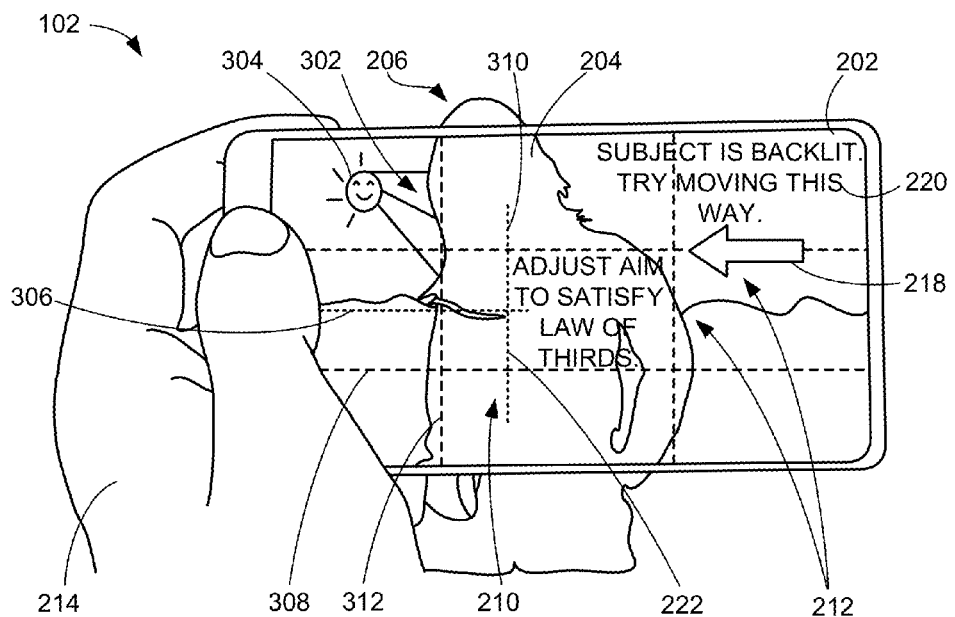
FIG. 3 is a pictorial view of the first device depicting a backlight augmentation.

Referring now to FIG. 3, therein is shown a pictorial view of the first device 102 depicting a backlight augmentation. The first device 102 is shown having the display 202 depicting the subjects 204 and the augmentations 212.

The first device 102 can display the augmentations 212 to recommend the potential adjustments 206 for moving the subjects 204 within the display 202. The potential adjustments 206 can include moving the subjects 204 for a lighting change 302 when the subjects 204 are obscured by glare, lens-flash, or backlighting described in detail below. The potential adjustments 206 can also be the composition change 210 of the subjects 204 when the subjects 204 are improperly framed, such as when the subjects 204 are cropped or directly centered described in detail below.

The augmentations 212 can be graphical overlays such as the arrows 218, the text 220, the informational lines 222, or symbols 304. As an example, the augmentations 212 can recommend the lighting change 302 of the subjects 204 by displaying the arrows 218 with the text 220 stating, "Subject is Backlit. Try moving this way."

In another example, the first device 102 can further display the symbols 304 in combination with the arrows 218 and the text 220 to recommend the lighting change 302. The symbols 304 can be a depiction of a light source such as a lamp, the sun, or a reflection, and can include a symbolic effect on the subjects 204 such as shading or hatching the subjects 204 to obscure the subjects 204. In combination the arrows 218, the text 220, and the symbols 304 can teach the user 214 how to incorporate the lighting change 302 to properly illuminate the subjects 204.

In another example, the augmentations 212 can recommend the composition change 210 of the subjects 204 by displaying the arrows 218 with the text 220 stating, "Adjust aim this way to satisfy the law of thirds." The first device 102 can further display the symbols 304 in combination with the arrows 218 and the text 220 to recommend the composition change 210 of the subjects 204. The symbols 304 can be a depiction of a horizontal demarcation 306 such as a ridgeline, a horizon, or a fence. The horizontal demarcation 306 is defined as one of the subjects 204 extending mostly level across a portion of the display 202.

As an example, the symbols 304 representing horizontal demarcation 306 in combination with the arrows 218 can recommend the composition change 210 of the horizontal demarcation 306 preferably along a horizontal thirds line 308. The informational lines 222 can also be used to indicate a centerline 310 of the subjects 204 and include the arrows 218 suggesting the composition change 210 of the subjects 204 depicted on the first device 102 to avoid bulls-eye syndrome by placing the subjects 204 slightly off-center, and preferably along a vertical thirds line 312. In combination the arrows 218, the text 220, and the symbols 304 can teach the user 214 how the composition change 210 of the subjects 204 within the display 202 of the first device 102 can be properly framed.

The augmentations 212 can aid and instruct the user 214 in the proper composition of a photograph or video by recommending the potential adjustments 206 of the subjects 204 captured by the first device 102 on the display 202. The augmentations 212 can further aid and instruct the user 214 in the proper lighting of a photograph by recommending the potential adjustments 206 of the subjects 204 captured by the first device 102 on the display 202.

Figure 4:
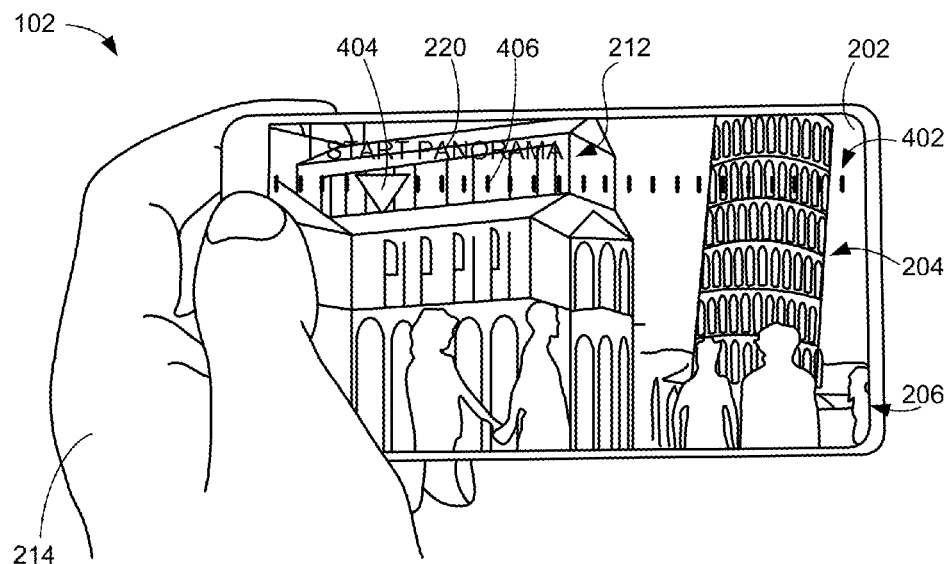
FIG. 4 is a pictorial view of the first device depicting a starting panorama augmentation.

Referring now to FIG. 4, therein is shown a pictorial view of the first device 102 depicting a starting panorama augmentation. The first device 102 is shown having the display 202 depicting the subjects 204. The subjects 204 can be buildings, a landscape, or people partially captured within the display 202 as a partial panoramic view 402.

The augmentations 212 can be graphical overlays such as compass points 404, hatch marks 406, and the text 220 and depicting the potential adjustments 206 since the subjects 204 are not fully depicted on the display 202. As an example, the augmentations 212 depicted on the display 202 can include the text 220 stationary on the display 202, while the hatch marks 406, the compass points 404, and the subjects 204 move on the display 202. The text 220 can indicate the progression through the panoramic sweep as well as updated instructions for successfully completing a panoramic capture of the subjects 204.

The hatch marks 406 and the compass points 404 can, for example, be fixed relative to the subjects 204 to indicate the precise movement of the subjects 204 within the display 202 and to provide feedback to the user 214 of the proper or improper movement of the first device 102. The augmentations 212 can aid and instruct the user 214 to properly implement the potential adjustments 206 for composing a panoramic photograph.

Figure 5:
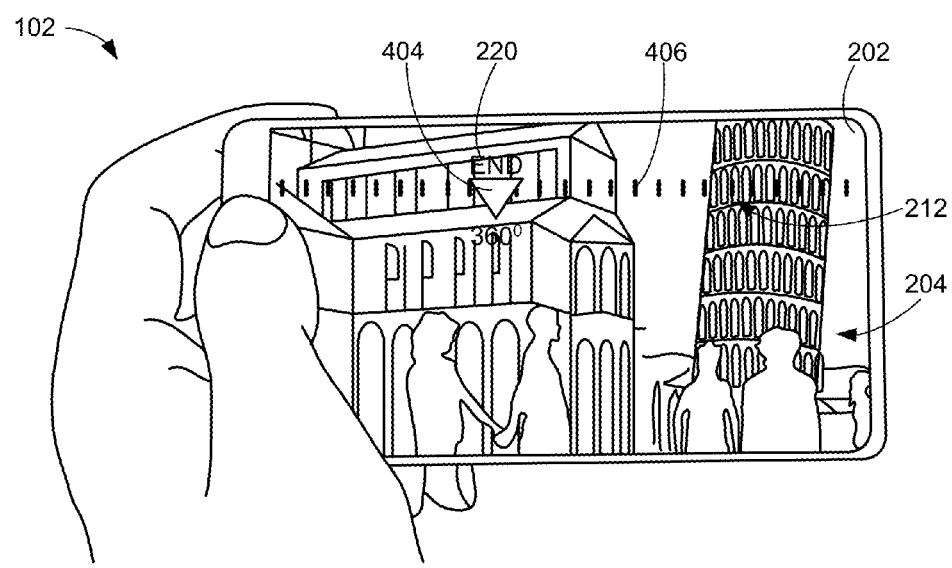
FIG. 5 is a pictorial view of the first device depicting an ending panorama augmentation.

Referring now to FIG. 5, therein is shown a pictorial view of the first device 102 depicting an ending panorama augmentation. The first device 102 is shown having the display 202 depicting the subjects 204 and the augmentations 212. The augmentations 212 can include the compass points 404, the hatch marks 406, and the text 220 to indicate the end of a panning motion for the first device 102. As an example, the text 220 can indicate an "end" of the panning shot as well as a "360°" panning movement through the subjects 204 with the first device 102.

Figure 6:
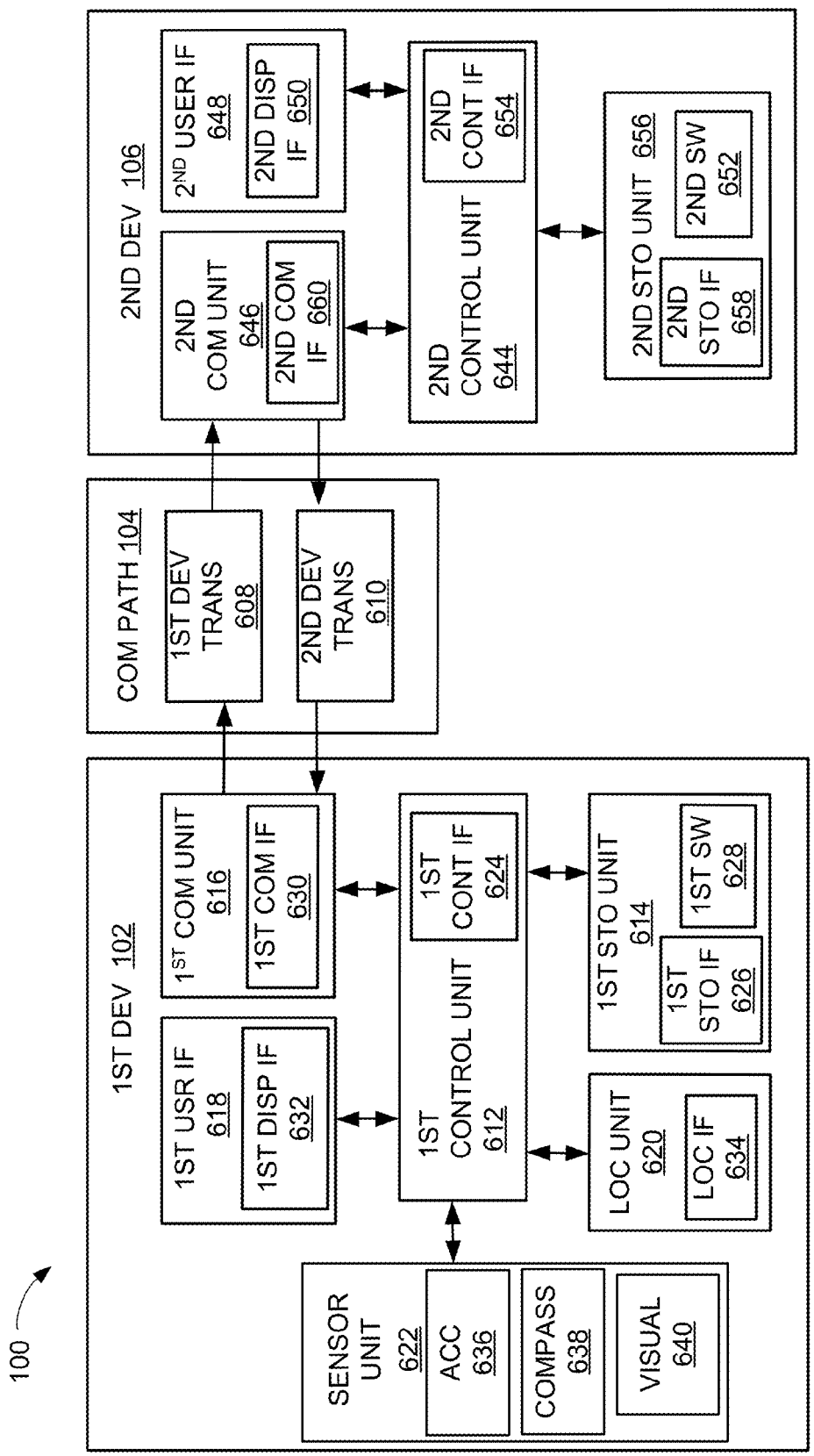
FIG. 6 is an exemplary block diagram of the electronic system.

Referring now to FIG. 6, therein is shown an exemplary block diagram of the electronic system 100. The electronic system 100 can include the first device 102, the communication path 104, and the second device 106. The first device 102 can send information in a first device transmission 608 over the communication path 104 to the second device 106. The second device 106 can send information in a second device transmission 610 over the communication path 104 to the first device 102.

For illustrative purposes, the electronic system 100 is shown with the first device 102 as a client device, although it is understood that the electronic system 100 can have the first device 102 as a different type of device. For example, the first device 102 can be a server.

Also for illustrative purposes, the electronic system 100 is shown with the second device 106 as a server, although it is understood that the electronic system 100 can have the second device 106 as a different type of device. For example, the second device 106 can be a client device.

For brevity of description in this embodiment of the present invention, the first device 102 will be described as a client device and the second device 106 will be described as a server device. The present invention is not limited to this selection for the type of devices. The selection is an example of the present invention.

The first device 102 can include a first control unit 612, a first storage unit 614, a first communication unit 616, a first user interface 618, a location unit 620 and a sensor unit 622. The first control unit 612 can include a first control interface 624. The first control unit 612 can execute a first software 628 to provide the intelligence of the electronic system 100. The first control unit 612 can be implemented in a number of different manners. For example, the first control unit 612 can be a processor, an embedded processor, a microprocessor, a hardware control logic, a hardware finite state machine (FSM), a digital signal processor (DSP), or a combination thereof. The first control interface 624 can be used for communication between the first control unit 612 and other functional units in the first device 102. The first control interface 624 can also be used for communication that is external to the first device 102.

The first control interface 624 can receive information from the other functional units or from external sources, or can transmit information to the other functional units or to external destinations. The external sources and the external destinations refer to sources and destinations physically separate from the first device 102.

The first control interface 624 can be implemented in different ways and can include different implementations depending on which functional units or external units are being interfaced with the first control interface 624. For example, the first control interface 624 can be implemented with a pressure sensor, an inertial sensor, a microelectromechanical system (MEMS), optical circuitry, waveguides, wireless circuitry, wireline circuitry, or a combination thereof.

The location unit 620 can generate location information, current heading, and current speed of the first device 102, as examples. The location unit 620 can be implemented in many ways. For example, the location unit 620 can function as at least a part of a global positioning system (GPS), an inertial navigation system, a cellular-tower location system, a pressure location system, or any combination thereof.

The location unit 620 can include a location interface 634. The location interface 634 can be used for communication between the location unit 620 and other functional units in the first device 102. The location interface 634 can also be used for communication that is external to the first device 102.

The location interface 634 can receive information from the other functional units or from external sources, or can transmit information to the other functional units or to external destinations. The external sources and the external destinations refer to sources and destinations physically separate from the first device 102.

The location interface 634 can include different implementations depending on which functional units or external units are being interfaced with the location unit 620. The location interface 634 can be implemented with technologies and techniques similar to the implementation of the first control interface 624.

The sensor unit 622 can generate information about the environment of the first device 102. The sensor unit 622 can include accelerometers 636, a compass 638, visual sensors 640, or any combination. The sensor unit 622 can generate movement information including torsion, acceleration, vibrations, direction, or heading as examples.

The first storage unit 614 can store the first software 628. The first storage unit 614 can also store the relevant information, such as advertisements, points of interest (POI), navigation routing entries, or any combination thereof.

The first storage unit 614 can be a volatile memory, a nonvolatile memory, an internal memory, an external memory, or a combination thereof. For example, the first storage unit 614 can be a nonvolatile storage such as nonvolatile random access memory (NVRAM), Flash memory, disk storage, or a volatile storage such as static random access memory (SRAM).

The first storage unit 614 can include a first storage interface 626. The first storage interface 626 can be used for communication between the location unit 620 and other functional units in the first device 102. The first storage interface 626 can also be used for communication that is external to the first device 102.

The first storage interface 626 can receive information from the other functional units or from external sources, or can transmit information to the other functional units or to external destinations. The external sources and the external destinations refer to sources and destinations physically separate from the first device 102.

The first storage interface 626 can include different implementations depending on which functional units or external units are being interfaced with the first storage unit 614. The first storage interface 626 can be implemented with technologies and techniques similar to the implementation of the first control interface 624.

The first communication unit 616 can enable external communication to and from the first device 102. For example, the first communication unit 616 can permit the first device 102 to communicate with the second device 106, an attachment, such as a peripheral device or a computer desktop, and the communication path 104.

The first communication unit 616 can also function as a communication hub allowing the first device 102 to function as part of the communication path 104 and not limited to be an end point or terminal unit to the communication path 104. The first communication unit 616 can include active and passive components, such as microelectronics or an antenna, for interaction with the communication path 104.

The first communication unit 616 can include a first communication interface 630. The first communication interface 630 can be used for communication between the first communication unit 616 and other functional units in the first device 102. The first communication interface 630 can receive information from the other functional units or can transmit information to the other functional units.

The first communication interface 630 can include different implementations depending on which functional units are being interfaced with the first communication unit 616. The first communication interface 630 can be implemented with technologies and techniques similar to the implementation of the first control interface 624.

The first user interface 618 allows the user 214 of FIG. 2 to interface and interact with the first device 102. The first user interface 618 can include an input device and an output device. Examples of the input device of the first user interface 618 can include a keypad, a touchpad, soft-keys, a depressible or touch sensitive backside switch, a keyboard, a microphone, or any combination thereof to provide data and communication inputs.

The first user interface 618 can include a first display interface 632. The first display interface 632 can include a display, a projector, a video screen, a speaker, or any combination thereof.

The first control unit 612 can operate the first display interface 632 to display information generated by the electronic system 100. The first control unit 612 can also execute the first software 628 for the other functions of the electronic system 100, including receiving location information from the location unit 620. The first control unit 612 can further execute the first software 628 for interaction with the communication path 104 via the first communication unit 616.

The second device 106 can be optimized for implementing the present invention in a multiple device embodiment with the first device 102. The second device 106 can provide the additional or higher performance processing power compared to the first device 102. The second device 106 can include a second control unit 644, a second communication unit 646, and a second user interface 648.

The second user interface 648 allows the user 214 to interface and interact with the second device 106. The second user interface 648 can include an input device and an output device. Examples of the input device of the second user interface 648 can include a keypad, a touchpad, soft-keys, a keyboard, a microphone, or any combination thereof to provide data and communication inputs. Examples of the output device of the second user interface 648 can include a second display interface 650. The second display interface 650 can include a display, a projector, a video screen, a speaker, or any combination thereof.

The second control unit 644 can execute a second software 652 to provide the intelligence of the second device 106 of the electronic system 100. The second software 652 can operate in conjunction with the first software 628. The second control unit 644 can provide additional performance compared to the first control unit 612.

The second control unit 644 can operate the second user interface 648 to display information. The second control unit 644 can also execute the second software 652 for the other functions of the electronic system 100, including operating the second communication unit 646 to communicate with the first device 102 over the communication path 104.

The second control unit 644 can be implemented in a number of different manners. For example, the second control unit 644 can be a processor, an embedded processor, a microprocessor, a hardware control logic, a hardware finite state machine (FSM), a digital signal processor (DSP), or a combination thereof.

The second control unit 644 can include a second control interface 654. The second control interface 654 can be used for communication between the second control unit 644 and other functional units in the second device 106. The second control interface 654 can also be used for communication that is external to the second device 106.

The second control interface 654 can receive information from the other functional units or from external sources, or can transmit information to the other functional units or to external destinations. The external sources and the external destinations refer to sources and destinations physically separate from the second device 106.

The second control interface 654 can be implemented in different ways and can include different implementations depending on which functional units or external units are being interfaced with the second control interface 654. For example, the second control interface 654 can be implemented with a pressure sensor, an inertial sensor, a microelectromechanical system (MEMS), optical circuitry, waveguides, wireless circuitry, wireline circuitry, or a combination thereof.

A second storage unit 656 can store the second software 652. The second storage unit 656 can also store the relevant information, such as advertisements, points of interest (POI), navigation routing entries, or any combination thereof. The second storage unit 656 can be sized to provide the additional storage capacity to supplement the first storage unit 614.

For illustrative purposes, the second storage unit 656 is shown as a single element, although it is understood that the second storage unit 656 can be a distribution of storage elements. Also for illustrative purposes, the electronic system 100 is shown with the second storage unit 656 as a single hierarchy storage system, although it is understood that the electronic system 100 can have the second storage unit 656 in a different configuration. For example, the second storage unit 656 can be formed with different storage technologies forming a memory hierarchal system including different levels of caching, main memory, rotating media, or off-line storage.

The second storage unit 656 can be a volatile memory, a nonvolatile memory, an internal memory, an external memory, or a combination thereof. For example, the second storage unit 656 can be a nonvolatile storage such as non-volatile random access memory (NVRAM), Flash memory, disk storage, or a volatile storage such as static random access memory (SRAM).

The second storage unit 656 can include a second storage interface 658. The second storage interface 658 can be used for communication between the location unit 620 and other functional units in the second device 106. The second storage interface 658 can also be used for communication that is external to the second device 106.

The second storage interface 658 can receive information from the other functional units or from external sources, or can transmit information to the other functional units or to external destinations. The external sources and the external destinations refer to sources and destinations physically separate from the second device 106.

The second storage interface 658 can include different implementations depending on which functional units or external units are being interfaced with the second storage unit 656. The second storage interface 658 can be implemented with technologies and techniques similar to the implementation of the second control interface 654.

The second communication unit 646 can enable external communication to and from the second device 106. For example, the second communication unit 646 can permit the second device 106 to communicate with the first device 102 over the communication path 104.

The second communication unit 646 can also function as a communication hub allowing the second device 106 to function as part of the communication path 104 and not limited to be an end point or terminal unit to the communication path 104. The second communication unit 646 can include active and passive components, such as microelectronics or an antenna, for interaction with the communication path 104.

The second communication unit 646 can include a second communication interface 660. The second communication interface 660 can be used for communication between the second communication unit 646 and other functional units in the second device 106. The second communication interface 660 can receive information from the other functional units or can transmit information to the other functional units.

The second communication interface 660 can include different implementations depending on which functional units are being interfaced with the second communication unit 646. The second communication interface 660 can be implemented with technologies and techniques similar to the implementation of the second control interface 654.

The first communication unit 616 can couple with the communication path 104 to send information to the second device 106 in the first device transmission 608. The second device 106 can receive information in the second communication unit 646 from the first device transmission 608 of the communication path 104.

The second communication unit 646 can couple with the communication path 104 to send information to the first device 102 in the second device transmission 610. The first device 102 can receive information in the first communication unit 616 from the second device transmission 610 of the communication path 104. The electronic system 100 can be executed by the first control unit 612, the second control unit 644, or a combination thereof.

For illustrative purposes, the second device 106 is shown with the partition having the second user interface 648, the second storage unit 656, the second control unit 644, and the second communication unit 646, although it is understood that the second device 106 can have a different partition. For example, the second software 652 can be partitioned differently such that some or all of its function can be in the second control unit 644 and the second communication unit 646. In addition, the second device 106 can include other functional units not shown in FIG. 6 for clarity.

The functional units in the first device 102 can work individually and independently of the other functional units. The first device 102 can work individually and independently from the second device 106 and the communication path 104.

The functional units in the second device 106 can work individually and independently of the other functional units. The second device 106 can work individually and independently from the first device 102 and the communication path 104.

For illustrative purposes, the electronic system 100 is described by operation of the first device 102 and the second device 106. It is understood that the first device 102 and the second device 106 can operate any of the modules and functions of the electronic system 100. For example, the first device 102 is described to operate the location unit 620, although it is understood that the second device 106 can also operate the location unit 620.

Figure 7:
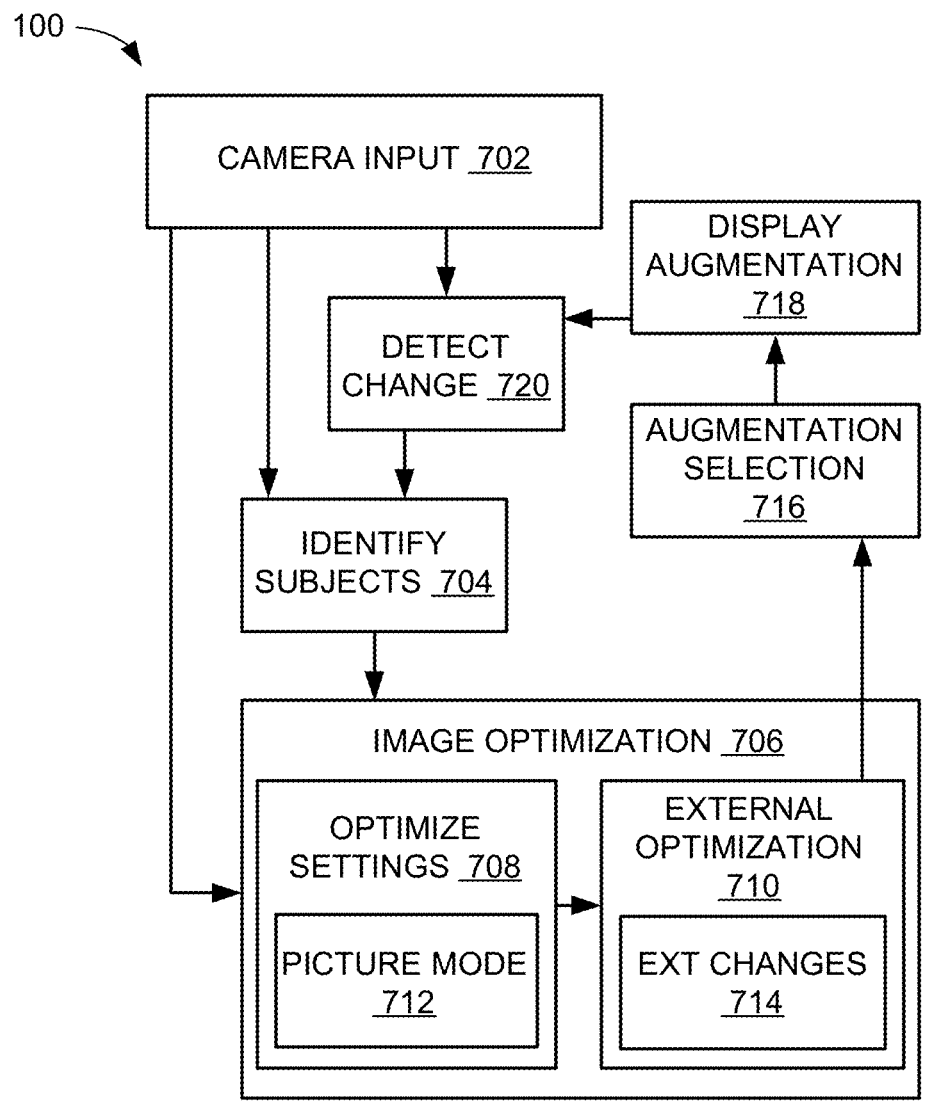
FIG. 7 is a control flow of the electronic system.

Referring now to FIG. 7, therein is shown a control flow of the electronic system 100. The electronic system 100 is shown having a camera input module 702 coupled to an identify subjects module 704 and an image optimization module 706. The camera input module 702 can output the image 226 of FIG. 2 of the first device 102 of FIG. 1. Coupling is defined as a physical connection between elements.

The identify subjects module 704 can scan the image 226 from the camera input module 702 to detect the subjects 204 of FIG. 2. The image optimization module 706 can include the subjects 204 from the identify subjects module 704 and the image 226 from the camera input module 702 in an optimize settings module 708 and in an external optimization module 710.

The optimize settings module 708 can select a picture mode 712 for the image 226 and the subjects 204 as described in detail below. The picture mode 712 is defined as picture exposure parameters. The external optimization module 710 can search for and detect the potential adjustments 206 of FIG. 2 including the composition change 210 of FIG. 2, the lighting change 302 of FIG. 3, and the size change 208 of FIG. 2 described in detail below.

The external optimization module 710 of the image optimization module 706 can further generate external changes 714. An augmentation selection module 716 can use the external changes 714 to select the augmentations 212 of FIG. 2 to aid the user 214 of FIG. 2 implement the potential adjustments 206. Selecting the external changes 714 and the augmentations 212 is described in detail below.

The external optimization module 710 of the image optimization module 706 is coupled to the augmentation selection module 716. The augmentation selection module 716 can be coupled to a display augmentation module 718.

The display augmentation module 718 can display the augmentations 212 on the display 202 of FIG. 2 to aid or teach the user 214 to adjust the first device 102 to better capture or light the subjects 204. The augmentation selection module 716 can be coupled to a detect change module 720.

The detect change module 720 can monitor the output of the camera input module 702 at set time intervals to determine whether the image 226 of the first device 102 has changed. The detect change module 720 is coupled to the identify subjects module 704 when the subjects 204 or the image 226 needs to be re-processed.

The camera input module 702 can output the first device transmission 608 of FIG. 6 or can output from the sensor unit 622 of FIG. 6 including from the accelerometers 636 of FIG. 6, the compass 638 of FIG. 6, and the visual sensors 640 of FIG. 6. The camera input module 702 can further output from the location unit 620 of FIG. 6 through the location interface 634 of FIG. 6.

The identify subjects module 704 can identify the subjects 204 on the first user interface 618 of FIG. 6 of the first device 102. The identify subjects module 704 can operate on the first control unit 612 of FIG. 6 or the second control unit 644 of FIG. 6 coupled to the first device 102.

The image optimization module 706 can operate on the first control unit 612 or the second control unit 644 to determine the picture mode 712 for the first device 102. The external optimization module 710 can operate on the first control unit 612 or the second control unit 644 to select the external changes 714 for the first device 102.

The augmentation selection module 716 can operate on the first control unit 612 or the second control unit 644 to select the augmentations 212 for display on the first device 102. The augmentations 212 can be stored within the first storage unit 614 of FIG. 6 or the second storage unit 656 of FIG. 6 of the second device 106 of FIG. 1.

When the identify subjects module 704, the image optimization module 706, the optimize settings module 708, the external optimization module 710, or the augmentation selection module 716 are operated on the second device 106, the communication path 104 of FIG. 1 can couple the second device 106 to the first device 102 and communicate with the second device transmission 610 of FIG. 6. The identify subjects module 704, the image optimization module 706, and the augmentation selection module 716 can operate as the first software 628 of FIG. 6 of the first storage unit 614 on the first control unit 612. Alternatively, the identify subjects module 704, the image optimization module 706, and the augmentation selection module 716 can operate as the second software 652 of FIG. 6 of the second storage unit 656 on the second control unit 644 or can operate on the first control unit 612.

The display augmentation module 718 can operate on the first control unit 612 to display the augmentations 212 on the display 202 of the first device 102. The detect change module 720 can operate on the first control unit 612 or the second control unit 644 and monitor the camera input module 702 from the first device 102.

The modules discussed above and below can be implemented in hardware. For example, the modules can be implemented as hardware implementations in the first control unit 612, the second control unit 644, or a combination thereof. The modules can also be implemented as hardware implementations in the first device 102, the second device 106, or a combination thereof outside of the first control unit 612 or the second control unit 644.

Figure 8:
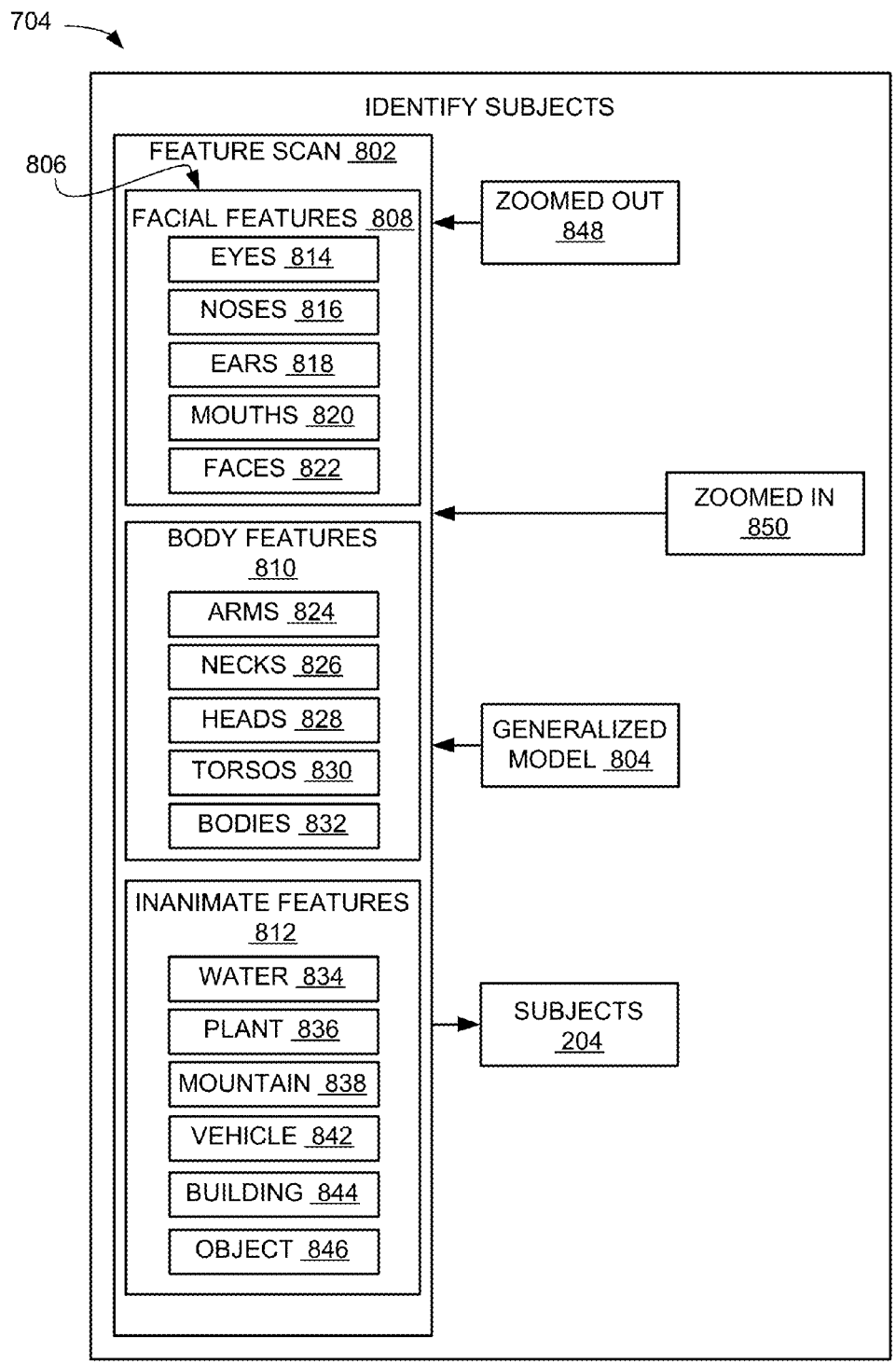
FIG. 8 is a control flow of the identify subjects module.

Referring now to FIG. 8, therein is shown a control flow of the identify subjects module 704. The identify subjects module 704 can include the outputs of the camera input module 702 of FIG. 7. The identify subjects module 704 can function to identify the subjects 204. The subjects 204 can be identified by scanning the image 226 of FIG. 2 from the camera input module 702 in a feature scan module 802.

The feature scan module 802 can scan the image 226 searching based on a generalized model 804 for identifiable features 806. The feature scan module 802 can search the image 226, with the generalized model 804, for facial features 808, body features 810, and inanimate features 812.

The facial features 808 can include eyes 814, noses 816, ears 818, and mouths 820. When the image 226 of the first device 102 of FIG. 1 includes the eyes 814, the noses 816, the ears 818, or the mouths 820, faces 822 can be detected.

The body features 810 can include arms 824, necks 826, heads 828, and torsos 830. When the image 226 of the first device 102 includes the arms 824, the necks 826, the heads 828, or the torsos 830, bodies 832 can be detected.

The inanimate features 812 can include water 834, plants 836, mountains 838, vehicles 842, and buildings 844. When the image 226 of the first device 102 includes the water 834, the plants 836, the mountains 838, the vehicles 842, or the buildings 844, inanimate objects 846 can be detected. The inanimate features 812 are defined as non-humanoid or animal objects.

The feature scan module 802 can scan the image 226 of the first device 102 as depicted in the display 202 of FIG. 2. The identify subjects module 704 can also include a zoomed out image 848 from the first device 102 and input the zoomed out image 848 into the feature scan module 802. The feature scan module 802 can scan the zoomed out image 848 to detect the identifiable features 806 in the zoomed out image 848. The feature scan module 802 can scan the zoomed out image 848 searching based on the generalized model 804 for the identifiable features 806.

The identify subjects module 704 can also include a zoomed in image 850 from the first device 102 and input the zoomed in image 850 into the feature scan module 802. The feature scan module 802 can scan the zoomed in image 850 to detect the identifiable features 806 in the zoomed in image 850. The feature scan module 802 can scan the zoomed in image 850 searching based on the generalized model 804 for the identifiable features 806.

The zoomed in image 850 and the zoomed out image 848 can be scanned by the feature scan module 802 without the user 214 of FIG. 2 viewing the zoomed in image 850 or the zoomed out image 848 on the display 202. The feature scan module 802 can output the subjects 204 within the display 202. The subjects 204 can include the faces 822, the bodies 832, and the inanimate objects 846 detected in the image 226.

It has been discovered that searching based on the generalized model 804 for the identifiable features 806 in the image 226, the zoomed out image 848, and the zoomed in image 850, aids the user 214 in incorporating the potential adjustments 206 of FIG. 2 into the capture of the subjects 204. The feature scan module 802 can operate on the first control unit 612 of FIG. 6 to scan the image 226 from the visual sensors 640 of FIG. 6 in the first device 102. The visual sensors 640 can input the zoomed in image 850 and the zoomed out image 848 to the identify subjects module 704 operating on the first control unit 612.

The feature scan module 802 can also operate on the second control unit 644 of FIG. 6 to scan the image 226 from the visual sensors 640 in the first device 102 and communicate to the first device 102 through the communication path 104 of FIG. 1. The faces 822, the bodies 832, and the inanimate objects 846 detected in the image 226 can be stored on the first storage unit 614 of FIG. 6 or the second storage unit 656 of FIG. 6 as the subjects 204.

The generalized model 804 can be stored in the first storage unit 614 or the second storage unit 656 and transmitted over the communication path 104. The generalized model 804 can be compared to the facial features 808, the body features 810, or the inanimate features 812 on the first control unit 612 or the second control unit 644 to determine the faces 822, the bodies 832, and the inanimate objects 846 detected in the image 226.

Figure 9:
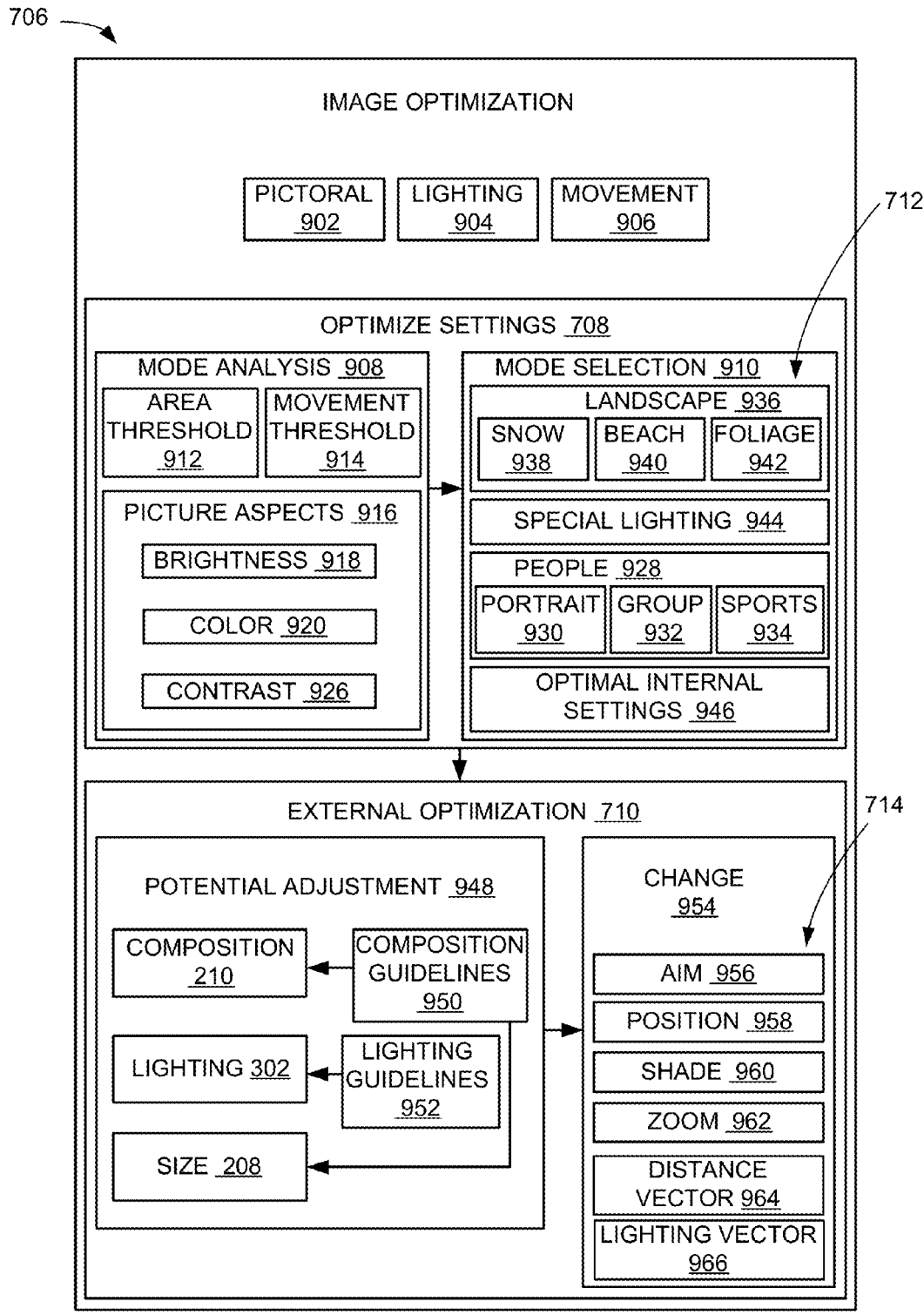
FIG. 9 is a control flow of the image optimization module.

Referring now to FIG. 9, therein is shown a control flow of the image optimization module 706. The image optimization module 706 can be coupled to the camera input module 702 of FIG. 7 and to the identify subjects module 704 of FIG. 7. The image optimization module 706 can include pictorial inputs 902, lighting inputs 904, and movement inputs 906 from the first device 102 of FIG. 1 input from the camera input module 702.

The optimize settings module 708 of the image optimization module 706 can include a mode analysis module 908 and a mode selection module 910. The mode analysis module 908 can compare the subjects 204 of FIG. 2 from the identify subjects module 704 and the image 226 of FIG. 2 from the camera input module 702 to an area threshold 912.

The area threshold 912 can be triggered by the size of the subjects 204 depicted on the display 202 of FIG. 2 in relation to the size of the display 202. For example, when one the subjects 204 falls below the area threshold 912 it can be too small in comparison to the size of the display 202. The mode analysis module 908 can restrict the subjects 204 falling below the area threshold 912 from use in the mode selection module 910.

The mode analysis module 908 can also include a movement threshold 914. The movement threshold 914 can be triggered by the movement of the subjects 204 on the display 202 relative to the subjects 204 or relative to the display 202. The subjects 204 exceeding the movement threshold 914 can trigger picture exposure parameters specific to motion in the mode selection module 910 discussed below.

The mode analysis module 908 can further detect picture aspects 916 of the image 226. The picture aspects 916 can be characteristics of the image 226 on the display 202 including a brightness range 918 of the image 226, a color temperature 920 of the image 226, and a contrast 926 of the image 226. The picture aspects 916 can be used in combination with the subjects 204, the area threshold 912, and the movement threshold 914 to determine the picture mode 712 in the mode selection module 910.

The mode selection module 910 can determine the picture mode 712 based on the subjects 204. When the subjects 204 include a person or people, the mode selection module 910 can select a people mode 928 as the picture mode 712. The people mode 928 can be subdivided to fine tune the picture mode 712 based on the subjects 204.

When the subjects 204 include one of the faces 822 of FIG. 8 above the area threshold 912, the mode selection module 910 can select a portrait mode 930 from the people mode 928 as the picture mode 712. When the subjects 204 of the image 226 include more than three of the faces 822, the mode selection module 910 can select a group mode 932 from the people mode 928 as the picture mode 712. When the mode analysis module 908 detects that the subjects 204 exceeds the movement threshold 914 and the subjects 204 include the bodies 832 of FIG. 8, the mode selection module 910 can select a sports mode 934 from the people mode 928 as the picture mode 712.

When the subjects 204 include the inanimate objects 846 of FIG. 8, the mode selection module 910 can select a landscape mode 936 as the picture mode 712. The landscape mode 936 can be further subdivided into a snow mode 938, selected based on the contrast 926, the brightness range 918, and the color temperature 920. The landscape mode 936 can be further subdivided into a beach mode 940, selected based on the color temperature 920 and the brightness range 918. The landscape mode 936 can be further subdivided into a foliage mode 942, selected based on the color temperature 920 and the contrast 926.

The picture mode 712 can also be a special lighting mode 944, selected based on the brightness range 918, the color temperature 920, and the contrast 926. When the brightness range 918 indicates indoor lighting, for example, the special lighting mode 944 can be used as the picture mode 712 for the image 226 of the first device 102.

The picture mode 712 can include the people mode 928, the landscape mode 936 and the special lighting mode 944. The people mode 928, the landscape mode 936 and the special lighting mode 944 can be used in combination or individually to provide optimal internal settings 946 for the image 226 and the subjects 204.

The external optimization module 710 can include, as inputs, the image 226 and the optimal internal settings 946 and the subjects 204. The external optimization module 710 can include a potential adjustment module 948.

The potential adjustment module 948 can include, as an input, the image 226 with the subjects 204 having the identifiable features 806 of FIG. 8 under the optimal internal settings 946. When the identifiable features 806 of the subjects 204 are not in accordance with composition guidelines 950 the potential adjustment module 948 can flag the composition change 210 or the size change 208 of the subjects 204 as recommended. When the identifiable features 806 of the subjects 204 are not in accordance with lighting guidelines 952, the potential adjustment module 948 can flag the lighting change 302 of the subjects 204 as recommended.

The potential adjustment module 948 can output the composition change 210, the lighting change 302, and the size change 208 to a change module 954. The change module 954 can output the external changes 714 based on the potential adjustment module 948 output and the image 226 of the display 202.

The change module 954 can map the potential adjustments 206 of FIG. 2 to the external changes 714 to select the external changes 714 for selecting the augmentation 212 of FIG. 2 described in detail below. The external changes 714 can include an aim adjustment 956, a position adjustment 958, a shade adjustment 960, or a zoom adjustment 962.

When the potential adjustments 206 represents the composition change 210 of the subjects 204, the change module 954 can map the composition change 210 to the aim adjustment 956 for signaling a pivot about one or more axes of the first device 102 is recommended to move the subjects 204 within the display 202. When the potential adjustments 206 represents the lighting change 302 of the subjects 204 the change module 954 can map the lighting change 302 to the position adjustment 958 for signaling a change the geographic coordinates of the first device 102 is recommended. When the potential adjustments 206 represents the lighting change 302 of the subjects 204 the change module 954 can also map the lighting change 302 to the shade adjustment 960 for signaling a blocking of a light source impacting the first device 102 is recommended.

When the potential adjustments 206 represents the size change 208 of the subjects 204, the change module 954 can map the size change 208 to the zoom adjustment 962 for signaling a change in focal length of the first device 102 is recommended to change the size of the subjects 204 within the display 202. The change module 954 can output the external changes 714 as the aim adjustment 956, the position adjustment 958, the shade adjustment 960, and the zoom adjustment 962 individually or in combination.

The change module 954 can output a distance vector 964 of the external changes 714 indicating the amount of the composition change 210 or the size change 208 of the subjects 204 on the display 202. The distance vector 964 can be calculated as the amount that the composition change 210 or the size change 208 of the subjects 204 required to conform the subjects 204 in the image 226 to the composition guidelines 950.

The change module 954 can output a lighting vector 966 of the external changes 714 required to effect the lighting change 302 of the subjects 204 on the display 202. The lighting vector 966 can be calculated as the amount of the lighting change 302 of the subjects 204 required to conform the subjects 204 in the image 226 to the lighting guidelines 952. The lighting vector 966 can be measured in lumens or candles.

The image optimization module 706 can operate on the first control unit 612 of FIG. 6 or the second control unit 644 of FIG. 6 in the second device 106 of FIG. 1. The identify subjects module 704 can be coupled to the image optimization module 706 through the first control interface 624 of FIG. 6 or can be coupled internally to the first control unit 612 when the identify subjects module 704 is operated on the first control unit 612.

The movement inputs 906 can be generated from the accelerometers 636 of FIG. 6 or the compass 638 of FIG. 6. The pictorial inputs 902 and the lighting inputs 904 can be generated from the visual sensors 640 of FIG. 6. The camera input module 702 can couple to the image optimization module 706 through the first control interface 624.

The image optimization module 706 including the mode analysis module 908 and the mode selection module 910 can operate on either the first control unit 612 or the second control unit 644. Alternatively, the image optimization module 706 can divide the operation of the mode analysis module 908 and the mode selection module 910 on either the first control unit 612 or the second control unit 644 and couple through the communication path 104 of FIG. 1.

The area threshold 912 and the movement threshold 914 can be stored in the first storage unit 614 of FIG. 6 or the second storage unit 656 of FIG. 6 and utilized within the first control unit 612 or the second control unit 644. The picture aspects 916 can be the pictorial inputs 902 from the visual sensors 640.

The external optimization module 710 can be implemented on the first control unit 612 or the second control unit 644. The potential adjustment module 948 and the change module 954 can be processed on both the first control unit 612 and the second control unit 644, or can operate on either one individually.

The external changes 714 can be stored in the first storage unit 614 or the second storage unit 656. The composition guidelines 950 and the lighting guidelines 952 can be stored within the first storage unit 614 or the second storage unit 656 and can be utilized thorough the first storage interface 626 of FIG. 6 or the second storage interface 658 of FIG. 6. The optimal internal settings 946 can be stored within the first storage unit 614 or the second storage unit 656 and can be utilized thorough the first storage interface 626 or the second storage interface 658.

The distance vector 964 and the lighting vector 966 can be calculated on the first control unit 612 or the second control unit 644. The lighting vector 966 and the distance vector 964 can be stored in the first storage unit 614 or the second storage unit 656.

Figure 10:
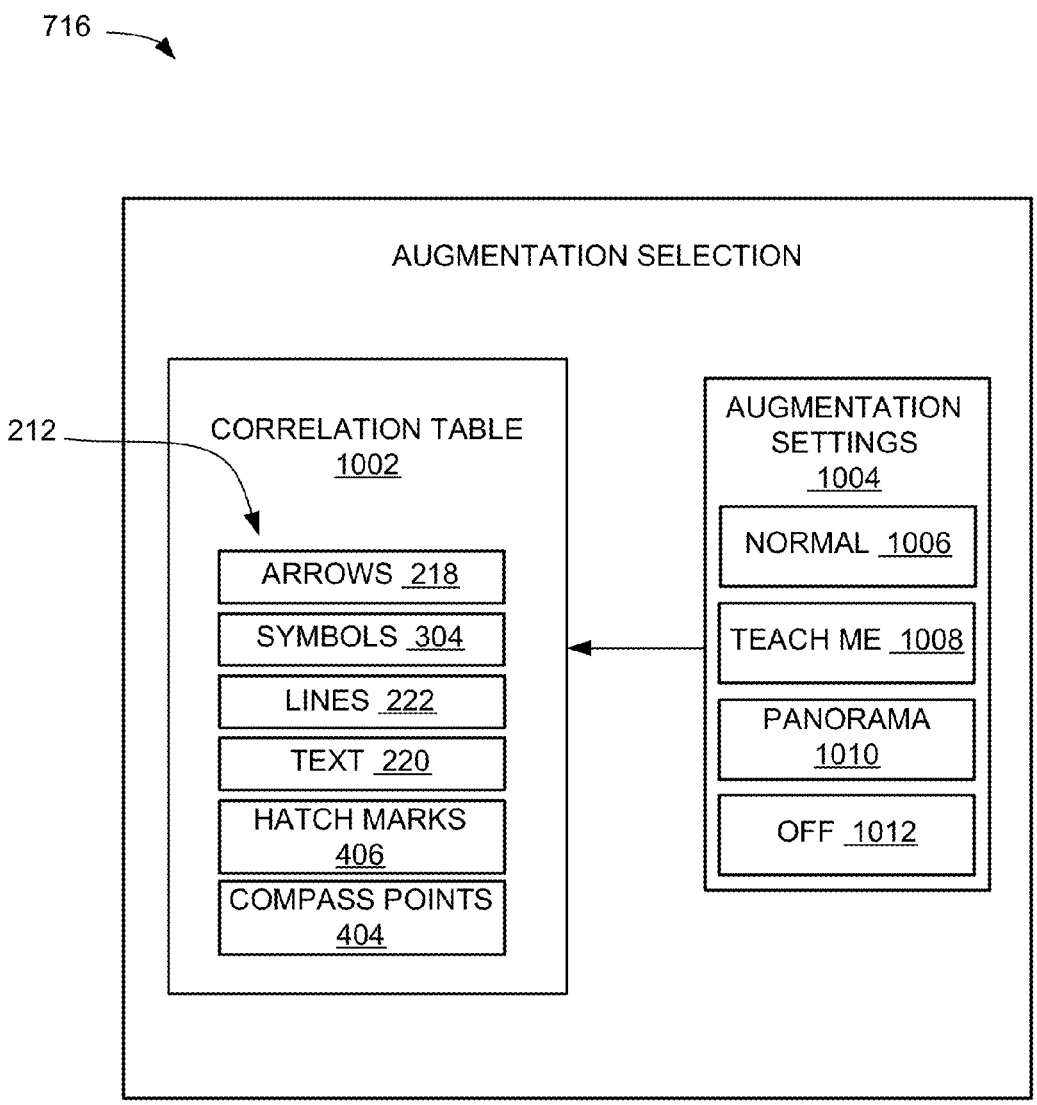
FIG. 10 is a control flow of the augmentation selection module.

Referring now to FIG. 10, therein is shown a control flow of the augmentation selection module 716. The augmentation selection module 716 can include inputs from the image optimization module 706 of FIG. 7 including inputs from the external optimization module 710 of FIG. 7.

The output of the external optimization module 710, including the external changes 714 of FIG. 7, the potential adjustments 206 of FIG. 2, the lighting vector 966 of FIG. 9 and the distance vector 964 of FIG. 9, are inputs to the augmentation selection module 716. The augmentation selection module 716 selects and outputs the augmentations 212 including the arrows 218, the symbols 304, the informational lines 222, the hatch marks 406, and the compass points 404 based on the inputs from the image optimization module 706.

The augmentation selection module 716 selects the augmentations 212 by matching the external changes 714 with the augmentations 212 within a correlation table 1002. The correlation table 1002 can include a listing of the external changes 714 correlated to the augmentations 212. As an example, the correlation table 1002 can include the aim adjustment 956 of FIG. 9 matched with the arrows 218 and the text 220.

As another example, the correlation table 1002 can include the position adjustment 958 of FIG. 9 matched with the arrows 218, the symbols 304, and the text 220. When the arrows 218 are selected, the augmentation selection module 716 can calculate how long the arrows 218 are and what direction the arrows 218 are pointing based on a linear relationship with the lighting vector 966 and the distance vector 964.

The augmentations 212, in some cases, can be further selected by correlating not only the external changes 714 but also the potential adjustments 206 within the correlation table 1002. For example, the symbols 304 can be selected within the correlation table 1002 when the external changes 714 correspond to the position adjustment 958. Further illustrating this example, when the potential adjustments 206 include the lighting change 302 of FIG. 3, to correct backlighting, the correlation table 1002 can further correlate the symbols 304 to a depiction of the backlighting source, contained within the correlation table 1002, such as a sun, moon, or lamp.

The augmentation selection module 716 can further refine the augmentations 212 selected with the correlation table 1002 based on augmentation settings 1004. The augmentation settings 1004 can include a normal setting 1006, a teach me setting 1008, a panorama setting 1010, and an off setting 1012.

The teach me setting 1008 can increase the amount of the text 220 that is correlated within the correlation table 1002 and displayed on the display 202 of FIG. 2. For example, when the teach me setting 1008 is activated the augmentation selection module 716 can include the composition guidelines 950 of FIG. 9 in the text 220 to instruct the user 214 of FIG. 2 why the augmentations 212 are being displayed. Further, when the teach me setting 1008 is activated the augmentation selection module 716 can include the lighting guidelines 952 of FIG. 9 in the text 220 to instruct the user 214 why the augmentations 212 are being displayed.

The panorama setting 1010 can signal a special correlation within the correlation table 1002 that correlates the potential adjustments 206 and the external changes 714 to the hatch marks 406 and the compass points 404. The text 220 can also be correlated differently within the correlation table 1002 when the panorama setting 1010 is activated by correlating to cardinal headings or panning instructions. When the off setting 1012 is activated, the correlation table will not correlate the augmentations 212 or select any of the augmentations 212 to be displayed on the display 202.

The augmentation selection module 716 can be coupled to the display augmentation module 718 of FIG. 7. The display augmentation module 718 can display the augmentations 212 on the display 202 of the first device 102 of FIG. 1. The display augmentation module 718 can offset the augmentations 212 from the center of the display 202 so as not to obstruct any of the facial features 808 of FIG. 8 detected by the feature scan module 802 of FIG. 8.

The display augmentation module 718 can be coupled to the detect change module 720 of FIG. 7. The detect change module 720 can monitor the camera input module 702 of FIG. 7 for any change of the image 226 of FIG. 2 on the display 202 of the first device 102. The detect change module 720 can monitor the camera input module 702 at preset periodic intervals.

The detect change module 720 can be coupled to the identify subjects module 704 of FIG. 7. The detect change module 720 can invoke the feature scan module 802 of the identify subjects module 704 when the detect change module 720 detects a change in the image 226 of the first device 102 from the camera input module 702.

It has been discovered that selecting the arrows 218, the symbols 304, the informational lines 222, the text 220, the hatch marks 406, and the compass points 404 by selecting the augmentations 212 correlating to the external changes 714 and the potential adjustments 206 within the correlation table 1002 of the augmentation selection module 716 allows the selection of the augmentations 212 that can teach the user 214 core photography principles about composition, lighting, position and settings. The image optimization module 706 can operate on the first control unit 612 of FIG. 6 of the first device 102. The image optimization module 706 can also operate on the second control unit 644 of FIG. 6. When the image optimization module 706 is operated on the second control unit 644, the image optimization module 706 can be coupled to the first device 102 with the communication path 104 of FIG. 1.

The augmentation selection module 716 can operate on the first control unit 612 or the second control unit 644. The augmentation selection module 716 can be coupled to the image optimization module 706 through the first control interface 624 of FIG. 6 or the second control interface 654 of FIG. 6. The correlation table 1002 of the augmentation selection module 716 can reside in the first storage unit 614 of FIG. 6 or the second storage unit 656 of FIG. 6.

The correlation table 1002 can include the augmentations 212 also stored in the first storage unit 614 or the second storage unit 656. The augmentations 212 can be transferred from the correlation table 1002 in the first storage unit 614 or the second storage unit 656 for display on the first device 102 through the first storage interface 626 of FIG. 6 or the second storage interface 658 of FIG. 6.

The augmentation settings 1004 can be selected by the user 214 from the first user interface 618 of FIG. 6. The first user interface 618 can be coupled to the first control unit 612 with the first control interface 624 and can be coupled to the second control unit 644 with the second control interface 654 through the communication path 104.

The display augmentation module 718 can operate on the first control unit 612 or the second control unit 644. The display augmentation module 718 can couple with the display 202 of the first device 102 for display of the augmentations 212 on the display 202.

The detect change module 720 can operate on the first control unit 612 or the second control unit 644. The detect change module 720 can monitor the accelerometers 636 of FIG. 6, the compass 638 of FIG. 6, or the visual sensors 640 of FIG. 6 of the sensor unit 622 of FIG. 6.

The detect change module 720 can couple to the identify subjects module 704. The identify subjects module 704 can operate on the second control unit 644 or the first control unit 612.

Physical transformation of changing the aim, position, or shade of the first device 102 by the user 214 occurs when the user 214 follows the instructions of the augmentations 212.

As the user 214 follows the augmentations 212, the user 214 interacts with the first device 102, physically changing the position of the first device 102 in the real world. The interaction by the user 214 creates additional information captured by the first device 102 and incorporated into the augmentations 212 further instructing the user 214 and modifying the placement of the first device 102.

Figure 11:
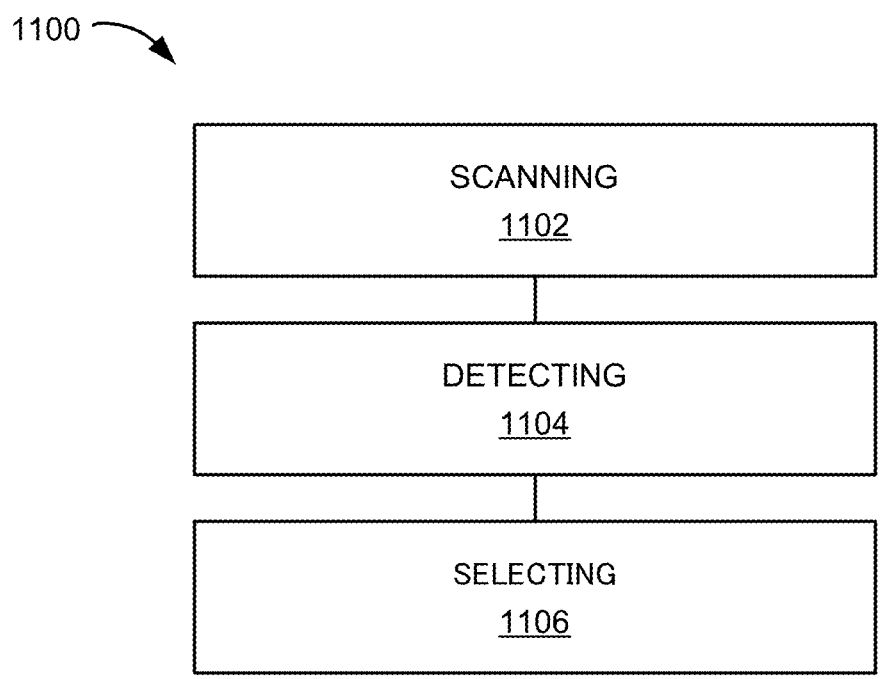
FIG. 11 is a flow chart of a method of operation of the electronic system in a further embodiment of the present invention.

Referring now to FIG. 11, therein is shown a flow chart of a method 1100 of operation of the electronic system in a further embodiment of the present invention. The method 1100 includes: scanning an image for detecting a subject in a block 1102; detecting a potential adjustment for moving the subject within the image in a block 1104; and selecting an augmentation for recommending the potential adjustment and for displaying the augmentation on a device in a block 1106.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of an electronic system comprising:
    scanning an image for detecting a subject;
    analyzing the image based on comparing a size of the subject to an area threshold;
    selecting a picture mode based on the image analyzed to restrict a usage of the picture mode by a control unit if the size of the subject is below the area threshold relative to a size of a display;
    detecting a potential adjustment for moving the subject within the image; and
    selecting an augmentation for recommending the potential adjustment and for displaying the augmentation on a device.

2. The method as claimed in claim 1 wherein detecting the potential adjustment includes flagging a composition change, a lighting change, or a size change of the subject.

3. The method as claimed in claim 1 further comprising selecting an aim adjustment, a position adjustment, a shade adjustment, a zoom adjustment, or a combination thereof for selecting the augmentation.

4. The method as claimed in claim 1 wherein selecting the augmentation includes selecting an arrow, a symbol, an informational line, a text, a compass point, a hatch mark, or a combination thereof.

5. The method as claimed in claim 1 wherein selecting the augmentation includes matching the potential adjustment with the augmentation in a correlation table.

6. The method as claimed in claim 1 wherein scanning the image includes scanning a zoomed out image and a zoomed in image for detecting the subject.

7. The method as claimed in claim 1 further comprising detecting a panorama setting, a normal setting, or a teach me setting for selecting the augmentation.

8. The method as claimed in claim 1 wherein scanning the image includes scanning the image for a facial feature, a body feature, an inanimate feature, or a combination thereof.

9. The method as claimed in claim 1 wherein detecting the potential adjustment includes comparing the image to a composition guideline, a lighting guideline, or a combination thereof.

10. An electronic system comprising:
    a control unit including a processor configured to:
        scan an image for detecting a subject,
        analyze the image based on comparing a size of the subject to an area threshold,
        select a picture mode based on the image analyzed,
        restrict a usage of the picture mode if the size of the subject is below the area threshold relative to a size of a display,
        detect a potential adjustment and moving the subject within the image,
        select an augmentation and recommending the potential adjustment, and
    a communication unit including a microelectronic, coupled to the control unit, for transmitting the augmentation for displaying the augmentation on a device.

11. The system as claimed in claim 10 wherein the control unit is configured to flag a composition change, a lighting change, or a size change of the subject.

12. The system as claimed in claim 10 wherein the control unit is configured to select an aim adjustment, a position adjustment, a shade adjustment, a zoom adjustment, or a combination thereof for selecting the augmentation.

13. The system as claimed in claim 10 wherein the control unit is configured to select an arrow, a symbol, an informational line, a text, a compass point, a hatch mark, or a combination thereof.

14. The system as claimed in claim 10 wherein the control unit is configured to match the potential adjustment with the augmentation in a correlation table.

15. The system as claimed in claim 10 wherein the control unit is configured to select the picture mode for the image.

16. The system as claimed in claim 15 wherein the control unit is configured to scan a zoomed out image and a zoomed in image for detecting the subject.

17. The system as claimed in claim 15 wherein the control unit is configured to detect a panorama setting, a normal setting, or a teach me setting for selecting the augmentation.

18. The system as claimed in claim 15 wherein the control unit is configured to scan the image for a facial feature, a body feature, an inanimate feature, or a combination thereof.

19. The system as claimed in claim 15 wherein the control unit is configured to compare the image to a composition guideline, a lighting guideline, or a combination thereof.

* * * * *